United States Patent [19]

Schutz

[11] Patent Number: 4,896,095
[45] Date of Patent: Jan. 23, 1990

[54] APPARATUS AND METHOD FOR DETERMINING FREQUENCY RESPONSE OF A SYSTEM UNDER TEST

[75] Inventor: Johann Schutz, Munich, Fed. Rep. of Germany

[73] Assignee: Schlumberger Messgerate GmbH, Munich, Fed. Rep. of Germany

[21] Appl. No.: 119,373

[22] Filed: Nov. 12, 1987

[30] Foreign Application Priority Data

Nov. 11, 1986 [DE] Fed. Rep. of Germany ....... 3638458

[51] Int. Cl.⁴ ............................................. G01R 27/00
[52] U.S. Cl. ..................................... 324/617; 324/612
[58] Field of Search .............. 324/57 R, 57 SS, 77 CS

[56] References Cited

U.S. PATENT DOCUMENTS 3,968,427 7/1976 Sharrit .............................. 324/57 SS
4,085,361 4/1978 Bathiany et al. ................. 324/57 SS
4,095,057 6/1978 Power et al. ..................... 324/57 SS

FOREIGN PATENT DOCUMENTS 0095732 5/1983 European Pat. Off. .
1320620 7/1971 United Kingdom .
1334463 7/1971 United Kingdom .
1546667 5/1976 United Kingdom .

OTHER PUBLICATIONS

Chapter 4, Integrated Devices in Digital Circuit Design, G. Hope, Wiley, 1981, pp. 387-389, Electronic Instrumentation and Measurement Techniques, W. D. Cooper (2nd Ed., Prentice-Hall, 1978).

Primary Examiner—Reinhard J. Eisenzopf
Assistant Examiner—Jack B. Harvey
Attorney, Agent, or Firm—Lowe, Price, Leblanc, Becker & Shur

[57] ABSTRACT

A circuit for determining frequency response includes a voltage controlled oscillator (VCO) which generates a signal for application to a system under test and a counter which either counts quartz-stabilized pulses during a VCO period or which counts, during a quartz-stabilized counting interval, the VCO output itself. The counts represent with quartz accuracy the test frequency, which corresponds to the mean value within the counting interval, and are associated with respective measurement of signal level returned from the unit under test to thereby establish frequency response. Counts, together with corresponding levels developed by the system under test, are applied to a suitable display.

8 Claims, 1 Drawing Sheet

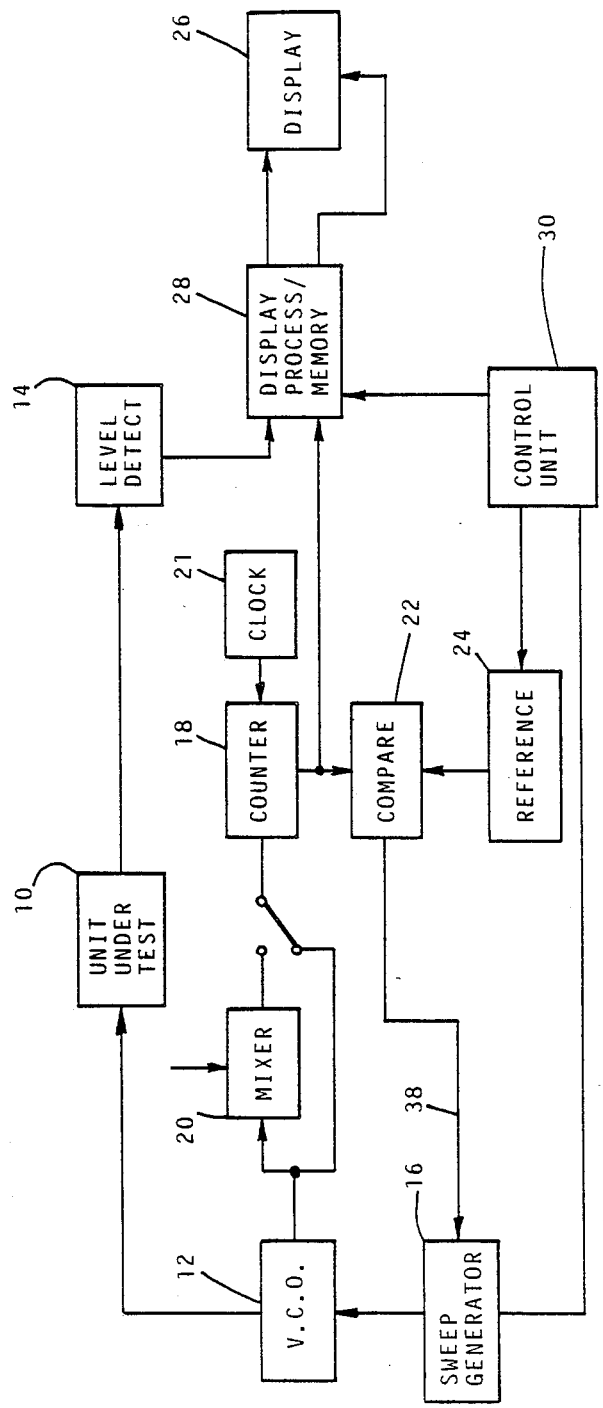

APPARATUS AND METHOD FOR DETERMINING FREQUENCY RESPONSE OF A SYSTEM UNDER TEST

This invention relates to a circuit for determining the frequency response of a unit under test, and is more particularly concerned with such a circuit of the kind comprising a variable frequency oscillator for producing a variable frequency test signal for application to the unit under test, a control signal generator for generating a control signal to vary the frequency of the oscillator, and a processing circuit for determining a parameter of the unit under test from measured values of the output signal produced by the unit under test in response to the test signal.

Such circuits are used, for example, to measure the amplitude-frequency characteristic of a network or to determine the frequency spectrum of a received signal. Typically, the oscillator comprises a voltage-controlled oscillator which generates a test signal whose frequency is wobbled (ie. varied) by a control voltage generator such as a saw-tooth voltage generator.

Usually, the variation with frequency of the parameter of the unit under test determined by the processing circuit is displayed on display means, typically a cathode ray tube. This requires signals representative of the actual frequency corresponding to each value determined for the parameter. This has been achieved in the past either by assuming that the control voltage applied to the voltage-controlled oscillator is representative of the frequency produced by the oscillator, or by periodically calibrating the oscillator, for example during the line return interval of the cathode ray tube, and for example by temporarily connecting the oscillator in a phase locked loop. Circuits operating generally in the latter way are disclosed for example in United Kingdom patent specification No. 1,546,667 and European patent application No. 00 95 732.

However, these prior circuits suffer from the drawback that the frequency response of the oscillator to its central voltage is not necessarily linear, and subject to drift, both of which clearly adversely affect the accuracy of the parameter vs. frequency determination. It is therefore an object of the present invention to provide a circuit of the kind specified above, in which simple variable-frequency oscillators and control signal generators can be used without the adverse effects encountered in the prior circuits.

According to the present invention, there is provided a circuit for determining the frequency response of a unit under test, the circuit comprising a variable frequency oscillator for producing a variable frequency test signal for application to the unit under test, a control signal generator for generating a control signal to vary the frequency of the oscillator, a processing circuit for determining a parameter of the unit under test from measured under test in response to the test signal, a counter connected to receive a reference frequency and a signal derived from the output of the oscillator and arranged to count one signal during a time interval defined by the other in order to produce respective counts each accurately representative of either the frequency or the period of the oscillator output signal, and a control unit for allocating each measured value of the output signal from the unit under test to the respective count obtained simultaneously therewith.

The FIGURE is a block diagram of apparatus for carrying out signal processing in accordance with the principles of the present invention.

Referring to the FIGURE, it is assumed that the unit 10 under test is a network whose frequency response (attenuation in response to frequency) is to be determined. Its input is fed with an AC voltage having a predetermined fixed amplitude but variable frequency, generated by voltage controlled oscillator (VCO) 12. A level detector 14 is connected to the output of the unit 10. The control voltage for VCO 12 is supplied by a sweep generator 16 which may be a simple saw tooth generator variable with respect to speed and direction.

Test frequencies generated by VCO 12 are fed to a counter 18. If the latter is unable to operate with extremely high clock frequencies, a mixer 20 may be used to convert the VCO output into a band of lower frequencies. The counter has a quartz-stabilized clock generator 21, which either determines the counting interval if the test frequencies are applied at the counting input of the counter, or which supplies pulses to be counter during a counting interval depending upon the test frequency period.

So that the apparatus may operate in a free running mode at the end of each counting interval the count is transferred to a comparator 22, which compares it with a reference value representative of the wobble frequencies and supplied by a control unit 30. If the count exceeds or falls below the reference value (depending upon the actual wobble direction of wobble generator 16), i.e. whenever the sign of the difference changes, the wobble direction is reversed via line 38, so that the sweep or wobble generator 16 is always within the range defined by control unit 30 by means of reference 24.

Further, and more significantly in relation to the present invention, the counts are applied to the display processing and storing unit 28. Each such count is allocated by the unit 28 to the respective level value from level detector 14 which is present simultaneously with the count. Each level value and its corresponding count are then converted into a form suitable for display by means of display device 26, which may be of a type having orthogonal axes with the counts displayed on one axis and values displayed on the other.

It will therefore be appreciated that during each upward or downward sweep of the output frequency of the VCO 12, the respective actual output frequency (or period) is accurately determined by the counter 18 and the generator 21 for each value of the signal at the output of level detector 14. Consequently, problems due to non-linearities in sweep rate and frequency drift in the VCO 12 and its control unit 30 are avoided.

The embodiment described above serves to generate a triangular periodic control voltage for VCO 12 via sweep generator 16. Alternatively by resetting or holding the sweep when the reference value is exceeded (for example) saw tooth or single shot sweep may be obtained.

Where the sweep generator is operating in a free running mode, since the counting interval is not synchronised with the sweep, the instantaneous amplitude and frequency co-ordinates obtained by the display processing and memory unit will be different between individual sweeps. Thus a display of accurately recorded values may be built up as sweeping progresses, resolution increasing with each sweep, there being no theoretical limit on the resolution which can be achieved.

I claim:

1. A circuit for determining the frequency response of a unit under test, the circuit comprising a variable frequency oscillator for outputting a variable frequency test signal for application to the unit under test, a control signal generator for generating a control signal to vary the frequency of the oscillator, a processing circuit for determining a parameter of the unit under test from measured values of an output signal produced by the unit under test in response to the test signal, a counter connected to receive (a) a reference frequency signal and (b) a signal derived from the test signal and arranged to count one of (a) and (b) during a time interval defined by the other one of (a) and (b) in order to produce a count accurately representative of either the frequency or the period of the test signal, respectively, and a control unit for controlling said processing circuit to associate each measured value of the output signal from the unit under test with the respective count obtained simultaneously therewith, to thereby determine the frequency response of said unit.

2. A circuit as claimed in claim 1, wherein the control unit is operatively connected to said control signal generator so as to define a predetermined frequency range for the oscillator in response to respective detected counts.

3. A circuit as claimed in claim 1 further comprising a mixer circuit connected between said variable frequency oscillator and said counter for converting frequencies of the test signal into a range in which the counter is able to operate.

4. A circuit as claimed in claim 1 and further comprising a comparator circuit for comparing detected counts with predetermined reference values and for generating a signal causing the control signal generator to reverse the direction in which the frequency of the oscillator is being varied upon sign change of the difference between count and reference value.

5. A circuit as in claim 4, comprising a memory for holding said reference values, a new reference value being read out from said memory upon each sign change.

6. A circuit as claimed in claim 1 and comprising display means having orthogonal axes, said counts appearing along one axis and said measured values appearing along the other axis.

7. A circuit as claimed in claim 2 further comprising a mixer circuit connected between said variable frequency oscillator and said counter for converting frequencies of the test signal into a range in which the counter is able to operate.

8. A method of determining the frequency response of a unit under test, comprising the steps of controlling a variable frequency oscillator to output a variable frequency test signal, applying the variable frequency test signal to the unit under test, generating a control signal to vary the frequency of the oscillator; measuring an output signal produced by the unit under test in response to the test signal; producing a reference frequency signal; counting a signal derived from the test signal during a time interval defined by the reference frequency signal, or counting the reference frequency signal during a time interval defined by the signal derived from the test signal, to produce a count accurately representative of either the frequency or period of the test signal, respectively, and associating measured values of the output signal from the unit under test with respective counts obtained simultaneously therewith to determine the frequency response of said unit under test.

* * * * *